United States Patent [19]

Ueda

[11] Patent Number: 4,880,998
[45] Date of Patent: Nov. 14, 1989

[54] BIPOLAR TRANSISTOR AND CMOS TRANSISTOR LOGIC CIRCUIT HAVING IMPROVED DISCHARGE CAPABILITIES

[75] Inventor: Masahiro Ueda, Itami, Japan

[73] Assignee: Mitsubishi Denki Kabushiki Kaisha, Tokyo, Japan

[21] Appl. No.: 179,299

[22] Filed: Apr. 8, 1988

[30] Foreign Application Priority Data

Sep. 8, 1987 [JP] Japan ................ 62-225003

[51] Int. Cl.$^4$ ............................. H03K 17/04
[52] U.S. Cl. .................... 307/446; 307/443; 307/451
[58] Field of Search .......... 307/443, 446, 451, 456, 307/475

[56] References Cited

U.S. PATENT DOCUMENTS

| 4,703,203 | 10/1987 | Gallup et al. | 307/446 |
| 4,719,370 | 1/1988 | Sugimoto | 307/446 |
| 4,769,561 | 9/1988 | Iwamura et al. | 307/443 X |

FOREIGN PATENT DOCUMENTS

0099100 1/1984 European Pat. Off. ........... 307/446

59-11034 7/1985 Japan .

OTHER PUBLICATIONS

NIKKEI ELECTRONICS 1985.8.12, "Bipolar Transistor and CMOS Transistor are . . . ", pp. 187–208.

ICCD 1984 Digest Paper, "A Subnanosecond Low Power Advanced Bipolar—CMOS Gate Array", Yoji Nishio et al., pp. 428–433.

*Primary Examiner*—David Hudspeth
*Attorney, Agent, or Firm*—Oblon, Spivak, McClelland, Maier & Neustadt

[57] ABSTRACT

The present invention provides a logic circuit which is formed by combination of bipolar transistors and CMOS transistors such that conduction of the bipolar transistors is controlled by the MOS transistors and an output load is charged/discharged by the conducting bipolar transistors. A logic part formed by combination of at least one or more NMOS transistors is provided between an output terminal and a low-potential power source, so that fall of output voltage in discharging is prompted by addition of discharge path through the logic part.

6 Claims, 3 Drawing Sheets

BIPOLAR TRANSISTOR AND CMOS TRANSISTOR LOGIC CIRCUIT HAVING IMPROVED DISCHARGE CAPABILITIES

BACKGROUND OF THE INVENTION

1. Field of the Invention

The present invention relates to a logic circuit which is formed by combination of bipolar transistors and CMOS transistors.

2. Description of the Prior Art

As is generally known, there are many logic circuits formed by combining bipolar transistors and CMOS transistors. FIG. 4 shows an inverter circuit as such a well-known logic circuit which is disclosed in Japanese Patent Laying-Open Gazette No. 11034/1984. Referring to FIG. 4, a PMOS transistor $T_1$ has a gate connected with an input terminal IN, a source connected with a high-potential power source 1 and a drain connected with an end of a first resistor $R_1$. Another end of the first resistor $R_1$ is connected to an output terminal OUT. An NMOS transistor $T_2$ has a gate connected with the input terminal IN, a drain connected with the output terminal OUT and a source connected with an end of a second resistor $R_2$. Another end of the second resistor $R_2$ is connected to a low-potential power source 2 of the ground level. A first NPN transistor $T_3$ is provided for charging an output load C and a second NPN transistor $T_4$ is provided for discharging the output load C. The first NPN transistor $T_3$ has a base connected to the drain of the PMOS transistor $T_1$, a collector connected to the high-potential power source 1 and an emitter connected to the output terminal OUT. The second NPN transistor $T_4$ has a base connected to the source of the NMOS transistor $T_2$, a collector connected to the output terminal OUT and an emitter connected to the low-potential power source 2. The output load C is not provided as an actural element, but expressed as the total sum of output capacity parasitic to the inverter itself and input capacity of a gate connected to a subsequent stage of the inverter.

When input voltage $V_{IN}$ of a low level (GND level) is applied to the input terminal IN in the aforementioned circuit, the NMOS transistor $T_2$ and the NPN transistor $T_4$ are turned off while the PMOS transistor $T_1$ is turned on. Since the PMOS transistor $T_1$ is thus turned on, the high-potential power source 1 supplies current to the base of the NPN transistor $T_3$ and the first resistor $R_1$, to turn on the NPN transistor $T_3$. Thus, the output load C between the output terminal OUT and the low-potential power source 2 is charged.

Assuming that $V_{DD}$ represents source voltage of the high-potential power source 1 and $V_{BE(T3)}$ represents forward voltage of the NPN transistor $T_3$ in the aforementioned process of charging the output load C, charging of the output load C is mainly performed through a current flow path by the NPN transistor $T_3$ in an interval $T_{OUT1}$ as shown in FIG. 5 in which the potential of the output terminal OUT, i.e., output voltage $V_{OUT}$ is:

$$V_{OUT} < V_{DD} - V_{BE(T3)} \tag{1}$$

When the current voltage $V_{OUT}$ becomes:

$$V_{OUT} \geq V_{DD} - V_{BE(T3)} \tag{2}$$

in an interval $T_{OUT2}$ as shown in FIG. 5, the NPN transistor $T_3$ is turned off and the output load C is charged through a path of the PMOS transistor $T_1$ and the resistor $R_1$. Thus, the output voltage $V_{OUT}$ is finally raised up to $V_{DD}$.

Then, when input voltage $V_{IN}$ of a high level ($V_{DD}$) is applied to the input terminal IN, the PMOS transistor $T_1$ and the NPN transistor $T_3$ are turned off while the NMOS transistor $T_2$ is turned on. Since the NMOB transistor $T_2$ is thus turned on, charges in the output load C flow to the base of the NPN transistor $T_4$ and the second resistor $R_2$ through the NMOS transistor $T_2$. Thus, the NPN transistor $T_4$ is turned on to rapidly discharge the output load C.

Assuming that $V_{BE(T4)}$ represents forward voltage of the NPN transistor $T_4$ in the aforementioned process of discharging the output load C, discharging is performed mainly through a current flow path by the NPN transistor $T_4$ in an interval $T_{IN1}$ as shown in FIG. 5, in which the output $V_{OUT}$ is:

$$V_{OUT} \geq V_{BE(T4)} \tag{3}$$

When the output voltage $V_{OUT}$ becomes:

$$V_{OUT} < V_{BE(T4)} \tag{4}$$

in an interval $T_{IN2}$ as shown in FIG. 5, the NPN transistor $T_4$ is turned off and discharging is performed through a path of the NMOS transistor $T_2$ and the resistor $R_2$. Thus, the output voltage $V_{OUT}$ is finally lowered to the GND level.

As obvious from the above description, the waveform in rise time of the output voltage $V_{OUT}$ is substantially determined by the value of resistance of the PMOS transistor $T_1$ in ON-state and the time constant on the basis of the resistance $R_1$ and the capacity of the output load C in a range of $V_{OUT} \geq V_{DD} - V_{BE(T3)}$ in this inverter circuit. Further, the waveform in fall time of the output voltage $V_{OUT}$ is substantially determined by the value of resistance of the NMOS transistor $T_2$ in ON-state and the time constant on the basis of the resistance $R_2$ and the capacity of the output load C in a range of $V_{OUT} \leq V_{BE(T4)}$.

In the conventional logic circuit as hereinabove described, it takes time for the output voltage $V_{OUT}$ to reach the $V_{DD}$ level or the GND level in the rise or fall time. When the input voltage $V_{IN}$ is increased in frequency, therefore, the input voltage $V_{IN}$ may be changed before the output voltage $V_{OUT}$ reaches the GND or $V_{DD}$ level as shown in FIG. 6 whereby no sufficient output amplitude can be obtained with respect to input amplitude. Thus, if the same logic circuits are connected with each other in multiple stages, for example, decrease in input amplitude to a subsequent stage causes reduction in noise margin in the subsequent stage as shown by symbol A in FIG. 6, or increase in current flowing between the high-potential power source 1 and the low-potential power source 2 through the transistors $T_1$ and $T_2$ in the subsequent stage.

In order to avoid this, it may be considered to reduce values of the resistances $R_1$ and $R_2$ while increasing current flow capacity of the PMOS transistor $T_1$ and the NMOS transistor $T_2$. However, such means leads to increase in current flowing between the high-potential power source 1 and the low-potential power source 2 through the transistors $T_1$ and $T_2$ in operation of the logic circuit as well as to increase in transistor area, whereby an integrated circuit formed through the logic circuit is increased in power consumption and chip area.

SUMMARY OF THE INVENTION

The present invention is directed to a logic circuit which is formed by combining bipolar transistors and MOS transistors.

A logic circuit according to a first invention comprises an input terminal; an output terminal; a high-potential power source; a low-potential power source; a PMOS transistor having a gate connected to the input terminal and a source connected to the high-potential power source; a first resistor having an end connected to the drain of the PMOS transistor and another end connected to the output terminal; a first NPN transistor having a base connected to a node between the first resistor and the PMOS transistor, a collector connected to the high-potential power source and an emitter connected to the output terminal; a first NMOS transistor having a gate connected to the input terminal and a drain connected to the output terminal; a second resistor having an end connected to the source of the NMOS transistor and another end connected to the low-potential power source; a second NPN transistor having a base connected to a node between the second resistor and the first NMOS transistor, a collector connected to the output terminal and an emitter connected to the low-potential power source; and a second NMOS transistor having a gate connected to the input terminal, a drain connected to the output terminal and a source connected to the low-potential power source.

A logic circuit according to a second invention comprises a plurality of input terminals; an output terminal; a high-potential power source; a low-potential power source; a first logic part consisting of a circuit member having an end connected to the high-potential source and being formed by combination of a plurality of PMOS transistors whose gates are connected to the input terminals respectively; a first resistor having an end connected to the other end of the circuit member of the first logic part and another end connected to the output terminal; a first NPN transistor having a base connected to a node between the first resistor and the first logic part, a collector connected to the high-potential power source and an emitter connected to the output terminal; a second logic part consisting of a circuit member having an end connected to the output terminal and being so formed as to be a conducting state when the first logic part is in a non-conducting state by combination of a plurality of NMOS transistors whose gates are connected to the respective input terminals; a second resistor having an end connected to the other end of the circuit member of the second logic part and another end connected to the low-potential power source: a second NPN transistor having a base connected to a node between the second resistor and the second logic part, a collector connected to the output terminal and an emitter connected to the low-potential power source; and a third logic part consisting of a circuit member parallel connected between the collector and the emitter of the second NPN transistor and being so formed as to be a conducting state when the first logic part is in a nonconducting state by combination of a plurality of NMOS transistors whose gates are connected to the input terminals respectively.

Accordingly, a principal object of the present invention is to provide a logic circuit whose output voltage quickly falls to enable high speed operation.

Another object of the present invention is to provide a logic circuit which causes no reduction in noise margin following increase in operating speed.

Still another object of the present invention is to provide a logic circuit which causes no increase in power consumption and chip area upon application to an integrated circuit.

According to the logic circuit of the first invention, the first NMOS transistor and the second NPN transistor are turned on when input voltage of a high level is applied to the input terminal. Thus, charges are discharged from an output load provided between the output terminal and the low-potential power source, so that the output voltage falls. The second NMOS transistor connected between the output terminal and the low-potential power source is also turned on in such fall time of the output voltage, whereby falling of the output voltage is prompted by addition of a discharge path through the second NMOS transistor.

According to the logic circuit of the second invention, the second logic part and the second NPN transistor enter conducting states when the input terminals are supplied with input voltage for bringing the first logic part into a nonconducting state. Thus, charges are discharged from an output load provided between the output terminal and the low-potential power source, Whereby the output voltage falls. The third logic part connected between the output terminal and the low-potential power source also enters a conducting state in such fall time of the output voltage, whereby falling of the output voltage is prompted by addition of a discharge path through the third logic part.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
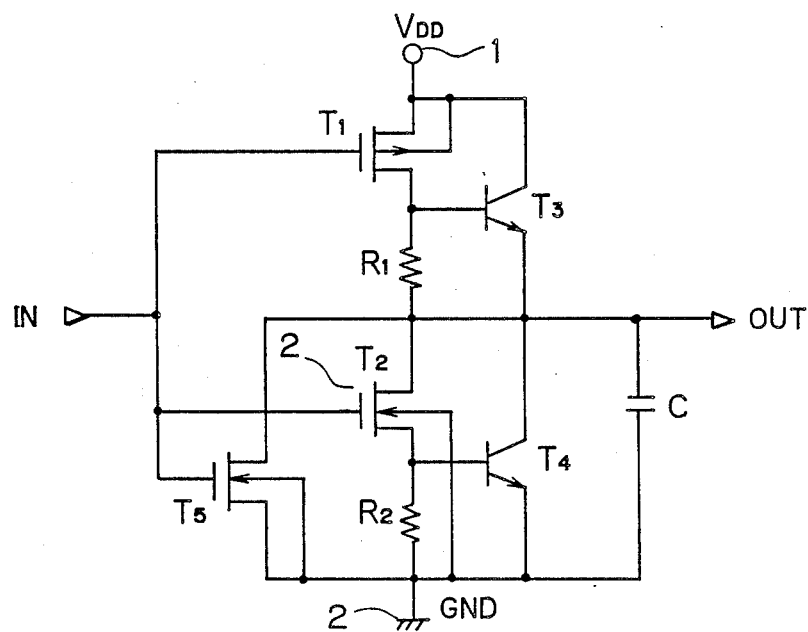
FIG. 1 is a circuit diagram showing an embodiment of a logic circuit according to the present invention.

FIG. 1 is a circuit diagram showing an embodiment of a logic circuit according to the present invention. Referring to FIG. 1, a high-potential power source 1, a low-potential power source 2, a PMOS transistor $T_1$, an NMOS transistor $T_2$, NPN transistors $T_3$ and $T_4$, an input terminal IN, an output terminal OUT and resistors $R_1$ and $R_2$ are absolutely identical to those of the conventional inverter circuit as hereinabove described.

The inverter circuit as shown in FIG. 1 is newly provided with an NMOS transistor $T_5$. This NMOS transistor $T_5$ has a gate connected with the input terminal IN, a drain connected to the output terminal OUT and a source connected to the low-potential power source 2.

In this inverter circuit, operation upon application of low-level input voltage $V_{IN}$ is similar to that of the aforementioned conventional circuit. Namely, the NMOS transistors $T_2$ and $T_5$ and the NPN transistor $T_4$ are turned off while the PMOS transistor $T_1$ is turned on. Thus, the high-potential power source 1 supplies current to the base of the NPN transistor $T_3$ and the resistor $R_1$ to turn on the NPN transistor $T_3$, thereby to charge an output load C until the output voltage $V_{OUT}$ becomes a $V_{DD}$ level (i.e., high level).

When high-level input voltage $V_{IN}$ is applied to the input terminal IN, the PMOS transistor $T_1$ and the NPN transistor $T_3$ are turned off while the NMOS transistors $T_2$ and $T_5$ are turned on. Thus, charges at the output load C are discharged through the NMOS transistors $T_2$ and $T_5$, and the NPN transistor $T_4$ is also turned onto that the output load C is rapidly discharged. When the potential of the output terminal OUT, i.e. the output voltage $V_{OUT}$ is lager than base-to-emitter forward voltage $V_{BE(T4)}$ of the NPN transistor $T_4$, the NFN transistor $T_4$ is turned off. However, even if the NPN transistor T is thus turned off, the discharge speed is not reduced due to presence of a discharge path through the NMOS transistor $T_5$ and a discharge path through the NMOS transistor $T_2$ and the resistor $R_2$, whereby the output voltage $V_{OUT}$ is rapidly lowered to the GND level.

Figure 2:
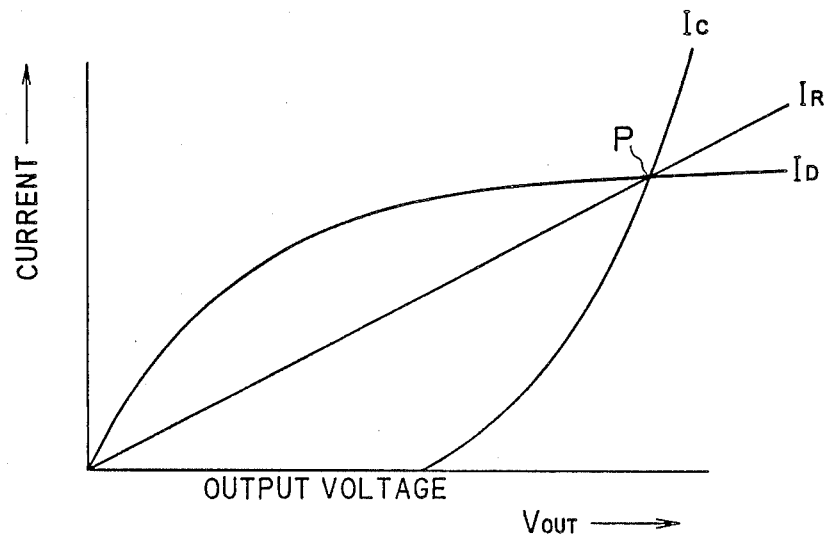
FIG. 2 is a graph showing current characteristics of the logic circuit in a discharge process.

FIG. 2 illustrates relation between the output voltage $V_{OUT}$ and collector current $I_C$ of the NPN transistor $T_4$, current $I_R$ flowing through the resistor $R_2$ and drain current ID (gate-to-source voltage $V_{GS)}=V_{DD}$) of the NMOS transistor $T_5$ in the aforementioned process of discharging the output load C. It is obvious from FIG. 2 that the NMOS transistor $T_5$ can sufficiently contribute to discharging even if the output voltage $V_{OUT}$ goes low, by setting the current characteristic of the NMOS transistor $T_5$ so that $I_D$ is higher in current value than P at a level of the output voltage $V_{OUT}$ corresponding to an intersection P between $I_C$ and $I_R$. Namely, operation similar to that of the conventional circuit is performed until the output voltage $V_{OUT}$ is lowered to a level approximate to the base-to-emitter forward voltage $V_{BE(T4)}$ of the NPN transistor $T_4$ upon the falling of the output voltage $V_{OUT}$. When the charges at the output load C are discharged mainly as the collector current $I_C$ of the NPN transistor $T_4$ and the output voltage $V_{OUT}$ goes lower than $V_{BE(T4)}$, the ration of discharge current flowing as the drain current $I_D$ of the NMOS transistor $T_5$ is increased. Thus, the output voltage $V_{OUT}$ is lowered to the GND level at a speed higher than that in the conventional circuit.

Since the NMOS transistor $T_5$ is parallely connected to the series circuit of the NMOS transistor $T_2$ and the resistor $R_2$ in this inverter circuit, discharging can be started in earlier timing by a single-state threshold value of the NMOS transistor $T_5$ as compared with the conventional case in which discharging is controlled by double-stage threshold values of the NMOS transistor $T_2$ and the NPN transistor $T_4$. The operating speed in the falling of the output voltage $V_{OUT}$ is increased also in this point. Since the operating speed in the falling of the output voltage $V_{OUT}$ is thus increased, sufficient output amplitude can be obtained even if the input voltage $V_{IN}$ is increased in frequency. Therefore, no input amplitude to a subsequent stage is reduced in case of connecting the same logic circuits in multiple stages. Thus, reduction in noise margin and increase in current flowing between the high-potential power source 1 and the low-potential power source 2 through the transistors $T_1$ and $T_2$ can be prevented in the subsequent stage.

Figure 3:
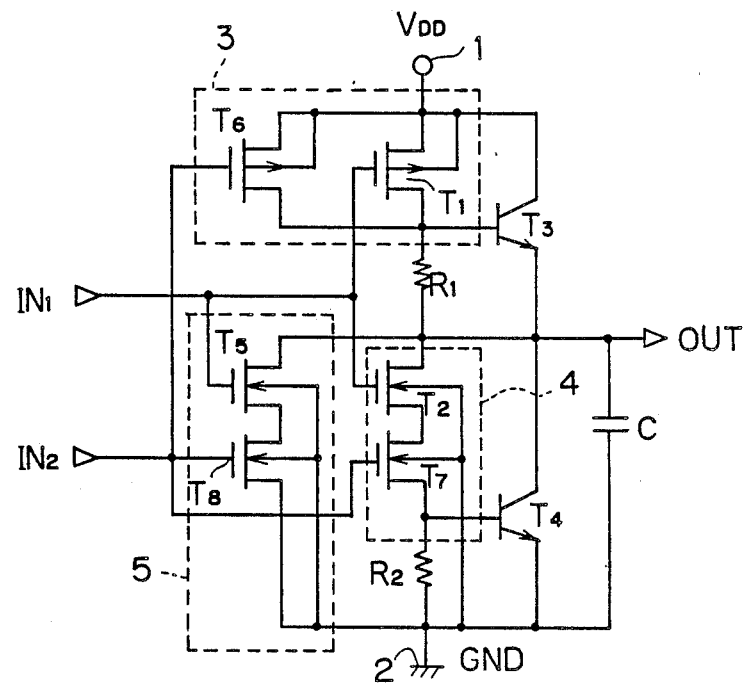
FIG. 3 is a circuit diagram showing another embodiment of the logic circuit according to the present invention.
Figure 4:
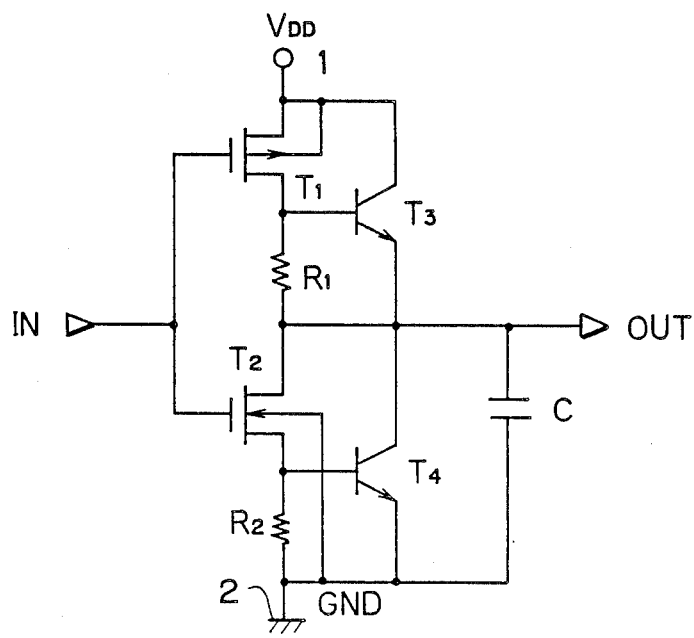
FIG. 4 is a circuit diagram showing a conventional logic circuit.
Figure 5:
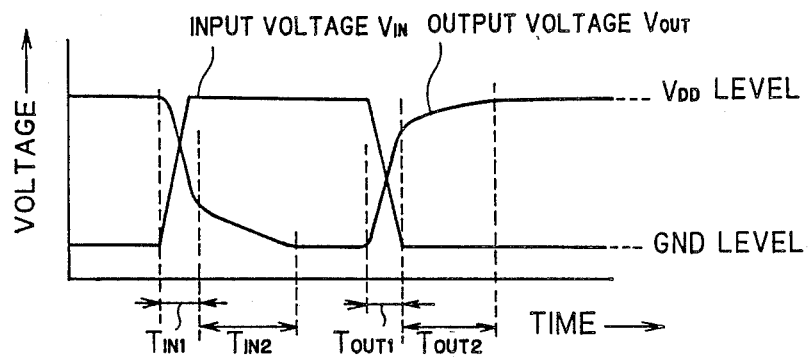
FIG. 5 is a waveform diagram in low-speed operation of the conventional logic circuit.
Figure 6:
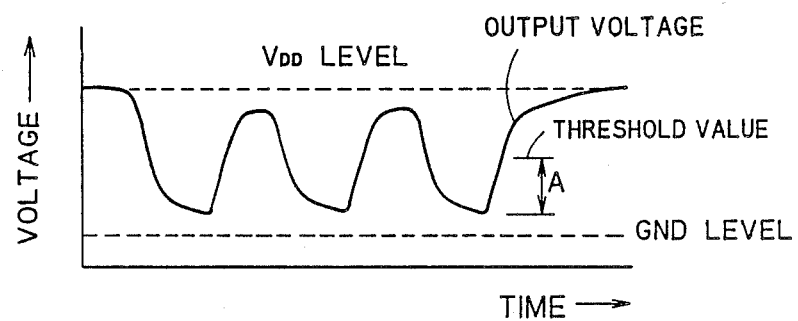
FIG. 6 is a waveform diagram in high-speed operation of the conventional logic circuit.

FIG. 3 is a circuit diagram showing another embodiment, in which the resent invention is applied to a two-input NAND gate. This logic circuit is provided with two input terminals $IN_1$ and $I_2$. Further, the transistors $T_1$, $T_2$ and $T_5$ as shown in FIG. 1 are replaced by first to third logic parts 3, 4 and 5 respectively. The first logic part 3 is formed by two PMOS transistors $Ti_l$ and $T_6$ which are connected in parallel with each other. The PMOS transistors $T_1$ and $T_6$ have sources connected to a high-potential power source 1, and drains connected to a resistor $R_1$. Further, the PMOS transistor $T_1$ has a gate connected to the first input terminal $IN_l$, while the PMOS transistor $T_6$ has a gate connected to the second input terminal $IN_2$. The second logic part 4 is formed by two NMOS transistors $T_2$ and $T_7$, which are connected in series with each other. Namely, the source of the NMOS transistor $T_2$ is connected with the drain of the NMOS transistor $T_7$. The NMOS transistor $T_2$ has a drain connected to the output terminal OUT, while the NMOS transistor $T_7$ has a source connected to the resistor $R_2$. Further, the NMOS transistor $T_2$ has a gate connected to the first input terminal $IN_1$, while the NMOS transistor $T_7$ has a gate connected to the second input terminal $IN_2$. The third logic part 5 is formed by two NMOS transistors $T_5$ and $T_8$ which are connected in series with each other. Namely, the source of the NMOS transistor $T_5$ is connected with the drain of the NMOS transistor $T_8$. The NMOS transistor $T_5$ has a drain connected to the output terminal OUT, while the NMOS transistor $T_8$ has a source connected to the low-potential power source 2. Further, the NMOS transistor $T_5$ has a gate connected to the first input terminal $IN_1$, while the NMOS transistor $T_8$ has a gate connected to the second input terminal $IN_2$. Other structure is similar to that of the embodiment as shown in FIG. 1.

When high-level input voltages $V_{IN1}$ and $V_{IN2}$ are applied to both of the first and second input terminals $IN_1$ and $IN_2$ in this two-input NAND gate, the two PMOS transistors $T_1$ and $T_6$ forming the first logic part 3 and the NPN transistor $T_3$ are turned off while both of the two NMOS transistors $T_2$ and $T_7$ forming the second logic part 4 and both of the two NMOS transistors $T_5$ and $T_8$ forming the third logic part 5 are turned on. Thus, charges at the output load C are discharged through the second and third logic parts 4 and 5, and the NPN transistor $T_4$ is also turned on to facilitate rapid discharging of the output load C. Then, the NPN transistor $T_4$ is turned off when the potential at the output terminal OUT, i.e., the output voltage $V_{OUT}$ becomes lower than the base-to-emitter forward voltage $V_{BE(T4)}$ of the NPN transistor $T_4$. However, even if the NPN transistor $T_4$ is thus turned off, the discharge speed is not reduced due to presence of the discharge path through the third logic part 5 and the discharge path through the second logic part 4 and the resistor $R_2$, and the output voltage $V_{OUT}$ is rapidly lowered to the GND level.

When, on the other hand, combination of the input voltages $V_{IN1}$ and $V_{IN2}$ applied to the two input terminals $IN_1$ and $IN_2$ is (H, L), (L, H) or (L, L), the operation is made as follows: At least one of the two NMOS transistors $T_2$ and $T_7$ forming the second logic part 4 is turned off, to cut off the electric path of the second logic part 4. Further, at least one of the two NMOS transistors $T_5$ and $T_8$ forming the third logic part 5 is turned off, to cut off the electric path of the third logic part 8. On the other hand, at least one of the two PMOS transistors $T_1$ and $T_6$ forming the first logic part 3 is turned on, whereby the electric path of the first logic part 3 is a conducting state. Thus, the high-potential power source 1 supplies current to the base of the NPN transistor $T_3$ and the resistor $R_1$ so that the NPN transistor $T_3$ is turned on. The output load C is thus charged until the output voltage $V_{OUT}$ becomes the $V_{DD}$ level (i.e., high level).

Although the two PMOS transistors $T_1$ and $T_6$ are parallely connected to form the first logic part 3, the two PMOS transistors $T_1$ and $T_6$ may be serially connected to form the first logic part 3. In this case, it is necessary to form the second logic part 4 by parallely connecting the two NMOS transistors $T_2$ and $T_7$, and it is necessary to form the third logic part 5 by parallely connecting the two NMOS transistors $T_5$ and $T_8$. Such a logic circuit forms a two-input NOR gate.

Although each of the number for the input terminals and those for the transistors forming the first to third logic parts 3 to 5 is set at two, such number may be set at three or more.

Further, the number and connecting relation of the PMOS transistors forming the first logic part 3 are not particularly restricted, while the numbers of the NMOS transistors forming the second and third logic parts 4 and 5 and connecting relation thereof are not particularly restricted. However, connecting relation between the first logic part 3 and the second and third logic parts 4 and 5 must be so set that the former must be in a cutoff state when the latter is in a conducting state, and vice versa.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A logic circuit formed by combination of a bipolar transistor and a CMOS transistor, said logic circuit comprising:
    an input terminal;
    an output terminal;
    a high-potential power source;
    a low-potential power source;
    a PMOS transistor having a gate connected to said input terminal and a source connected to said high-potential power source;
    a first resistor having an end connected to the drain of said PMOS transistor and another end connected to said output terminal:
    a first NPN transistor having a base connected to a node between said first resistor and said PMOS transistor, a collector connected to said high-potential power source and an emitter connected to said output terminal;
    a first NMOS transistor having a gate connected to said input terminal and a drain connected to said output terminal;
    a second resistor having an end connected to the source of said NMOS transistor and another end connected to said low-potential power source;
    a second NPN transistor having a base connected to a node between said second resistor and said first NMOS transistor, a collector connected to said output terminal and an emitter connected to said low-potential power source; and
    a second NMOS transistor having a gate directly connected to said input terminal, a drain connected to said output terminal and a source connected to said low-potential power source respectively.

2. A logic circuit formed by combination of bipolar transistors and CMOS transistors, said logic circuit comprising:
    a plurality of input terminals;
    an output terminal;
    a high-potential power source;
    a low-potential power source;
    a first logic part consisting of a sub-circuit formed by combination of a plurality of PMOS transistors and having an end connected to said high-potential power source, said PMOS transistors having gates connected to said input terminals respectively;
    a first resistor having an end connected to the other end of said sub-circuit of said first logic part and another end connected to said output terminal;
    a first NPN transistor having a base connected to a node between said first resistor and said first logic part, a collector connected to said high-potential power source and an emitter connected to said output terminal;
    a second logic part consisting of a sub-circuit being so formed by combination of a plurality of NMOS transistors as to be a conducting state when said first logic part is in a nonconducting state and having an end connected to said output terminal, said NMOS transistors having gates connected to said input terminals respectively;
    a second resistor having an end connected to the other end of said sub-circuit of said second logic part and another end connected to said low-potential power source;
    a second NPN transistor having a base connected to a node between said second resistor and said second logic part, a collector connected to said output terminal and an emitter connected to said low-potential power source; and
    a third logic part consisting of a sub-circuit being so formed by combination of a plurality of NMOS transistors as to be a conducting state when said first logic part is in a nonconducting state and parallely connected between said collector and said emitter of said second NPN transistor, said NMOS transistors having gates directly connected to said input terminals respectively.

3. A logic circuit in accordance with claim 2, wherein said first logic part is formed by a plurality of parallely connected PMOS transistors,
said second logic part is formed by a plurality of serially connected NMOS transistors, and
said third logic part is formed by a plurality of serially connected NMOS transistors.

4. A logic circuit in accordance with claim 3, wherein said first logic part is formed by two PMOS transistors, and
each of said second and third logic parts is formed by two NMOS transistors.

5. A logic circuit in accordance with claim 2, wherein said first logic part is formed by a plurality of serially connected PMOS transistors, said second logic part is formed by a plurality of parallely connected NMOS transistors, and
said third logic part is formed by a plurality of parallely connected NMOS transistors.

6. A logic circuit in accordance with claim 5, wherein said first logic part is formed by two PMOS transistors, and
each of said second and third logic parts is formed by two NMOS transistors.

* * * * *